(12) United States Patent
Zhou et al.

(10) Patent No.: US 6,999,826 B1
(45) Date of Patent: *Feb. 14, 2006

(54) APPARATUS AND METHOD FOR IMPROVED PC AUDIO QUALITY

(75) Inventors: Jian Zhou, San Jose, CA (US); Jianxin Liu, Mountain View, CA (US); Zhengran Li, Campbell, CA (US)

(73) Assignee: Zoran Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/195,129

(22) Filed: Nov. 18, 1998

(51) Int. Cl.
*G06F 17/00* (2006.01)
*H03F 5/00* (2006.01)

(52) U.S. Cl. .......................... 700/94; 381/103
(58) Field of Classification Search ................ 381/103, 381/96, 53, 59, 99; 333/28 R
See application file for complete search history.

(56) References Cited

U.S. PATENT DOCUMENTS

| | | | |
|---|---|---|---|
| 4,939,782 A * | 7/1990 | Gambacurta et al. | 381/103 |
| 5,210,806 A * | 5/1993 | Kihara et al. | 381/103 |
| 5,384,856 A * | 1/1995 | Kyouno et al. | 381/103 |
| 5,727,074 A * | 3/1998 | Hildebrand | 381/103 |
| 5,737,254 A * | 4/1998 | Lane et al. | 364/724.17 |
| 5,881,103 A * | 3/1999 | Wong et al. | 381/103 |
| 5,892,833 A * | 4/1999 | Maag et al. | 381/98 |
| 6,163,789 A * | 12/2000 | Liu | 708/323 |
| 6,178,514 B1 * | 1/2001 | Wood | 713/300 |
| 6,195,435 B1 * | 2/2001 | Kitamura | 381/18 |
| 6,359,987 B1 * | 3/2002 | Tran et al. | 381/58 |
| 6,519,344 B1 * | 2/2003 | Yajima et al. | 381/103 |

* cited by examiner

*Primary Examiner*—Laura A. Grier
(74) *Attorney, Agent, or Firm*—Morgan, Lewis & Bockius LLP

(57) ABSTRACT

A computer readable memory to direct a computer to improve the perceived audio quality of a speaker included in that computer. The computer readable memory stores a first, second and third set of instructions. The first set of instructions causes the computer to determine the speaker type. The second set of instructions causes the computer to select a set of default filter coefficients for a digital filter based upon the speaker type. Finally, the third set of instructions causes the computer to realize a digital parametric equalizer using a digital filter and the set of default filter coefficients. Thus, the digital filter alters the audio signal that is input to the speaker, thereby improving the perceived quality of the speaker.

10 Claims, 12 Drawing Sheets

APPARATUS AND METHOD FOR IMPROVED PC AUDIO QUALITY

FIELD OF THE INVENTION

The present invention relates generally to digital audio systems. In particular, the present invention relates to a digital audio system that improves perceived personal computer audio quality using a digital parametric equalizer and automatically providing default parameter values based upon the type of speaker included in the personal computer.

BACKGROUND OF THE INVENTION

Most personal computers currently available include simple audio systems to allow users to play music and to provide sound effects for games. These audio systems typically provide poor quality sound, primarily because of the quality of the speakers included in them.

Many stand-alone high fidelity audio systems include a parametric equalizer to allow listeners to compensate for, or alter, the perceived sound quality of their speakers. However, most personal computers do not include parametric equalizers. Even given a personal computer audio system including a parametric equalizer, many users may not be able to improve perceived sound quality because they either do not care to use the equalizer or are unable to determine appropriate equalizer settings.

Thus, a need exists for a personal computer audio system that would automatically improve the perceived sound quality of the speakers without requiring user input, while still accommodating user input. Such a personal audio system should be inexpensive and require no replacement of existing personal computer speakers.

A second-order digital all-pass filter implementation of a parametric audio equalizer is described in: Massie, *An Engineering Study of the Four-Multiply Normalized Ladder Filter*, Journal of Audio Engineering Society, vol. 7/8, July/August 1993. The transfer function of Massie's four-multiply normalized ladder filter is given by Relationship 1.

$$F(z)=[1+A(z)]/2+G[1-A(z)]/2 \quad (1)$$

where:
G is the cut/boot parameter; and
and A(z) is described by Relationship 2.

$$A(z)=(z^{-2}+k_1(1+k_2)z^{-1}+k_2)/(1+k_1/(1+k_2)z^{-1}+k_2z^{-2}) \quad (2)$$

where:
$k_1$ is the equalizer's first tuning coefficient;
$k_2$ is the equalizer's second tuning coefficient; and
$z^{-1}$ represents a unit delay.

The values of the first and second tuning coefficients can be calculated given values for the equalizer parameters: center frequency and bandwidth.

$$k_1=-\cos(2\pi F_c/F_s) \quad (3)$$

$$k_2=(1-\tan(\pi F_c/(F_sQ)))/(1+\tan(\pi F_c/(F_sQ)) \quad (4)$$

where:
$F_c$ is center frequency;
$F_s$ is sampling frequency; and
Q is a quality factor given by $F_c$/Bandwidth.

FIG. 1 is a signal flow diagram for a four-multiply normalized ladder filter for implementing the parametric equalizer transfer function of Relationship 1. This implementation introduces two filter coefficients, $c_1$ and $c_2$, whose values are defined by Relationships 5 and 6.

$$c_1=\sqrt{(1-k_1^2)} \quad (5)$$

$$c_2=\sqrt{(1-k_2^2)} \quad (6)$$

FIG. 1 also indicates the values at various internal nodes, $w_1, w_2, w_3, w_4$ and $w_5$, within the ladder filter.

Given the signal flow diagram of FIG. 1 and a digital signal processor(DSP), software instructions to implement the four-multiply ladder filter can readily be generated by one of ordinary skill in the art. Massie discloses one set of possible instructions to do so in his paper.

FIG. 2 illustrates the cut and boost spectrums of an implementation of Massie's four-multiply ladder filter. Note that the cut and boost spectrums are not symmetrical; nor are the cut and boost bandwidths identical. The cut bandwidth is approximately 1500 Hz as compared to the boost bandwidth of 2000 Hz. This unexpected spectrum asymmetry during cut and boost is undesirable for audio applications. One reason this asymmetry is undesirable is because it limits the ability of the ladder filter to filter out undesired frequencies, like the higher order harmonics generated by AC power supplies.

Thus, it would be highly desirable to provide a digital audio system with improved audio quality. In particular, it would be highly desirable to provide a digital parametric equalizer with substantially symmetrical cut and boost spectrums.

SUMMARY OF THE INVENTION

A computer readable memory of the present invention enables a computer including a speaker to improve the perceived audio quality of that speaker. The computer readable memory stores a first, second and third set of instructions. The first set of instructions causes the computer to determine the speaker type. The second set of instructions causes the computer to select a set of default filter coefficients for a digital filter based upon the speaker type. Finally, the third set of instructions causes the computer to realize a parametric equalizer using a digital filter and the set of default filter coefficients. The digital filter alters the audio signal input to the speaker, thus improving the perceived quality of the speaker.

In another embodiment of the present invention, the computer readable memory also stores a fourth and fifth set of instructions. The fourth set of instructions enables the computer to receive user specified equalizer parameters for the parametric equalizer, while the fifth set of instructions enables the computer to calculate from the user specified equalizer parameters another set of filter coefficients, which replace the set of default filter coefficients.

Other objects, features, and advantages of the present invention will be apparent from the accompanying drawings and detailed description that follows.

BRIEF DESCRIPTION OF THE DRAWINGS

The present invention is illustrated by way of example and not by way of limitation in the figures of the accompanying drawings. In the accompanying drawings similar references indicate similar elements.

DETAILED DESCRIPTION OF THE INVENTION

Figure 3:
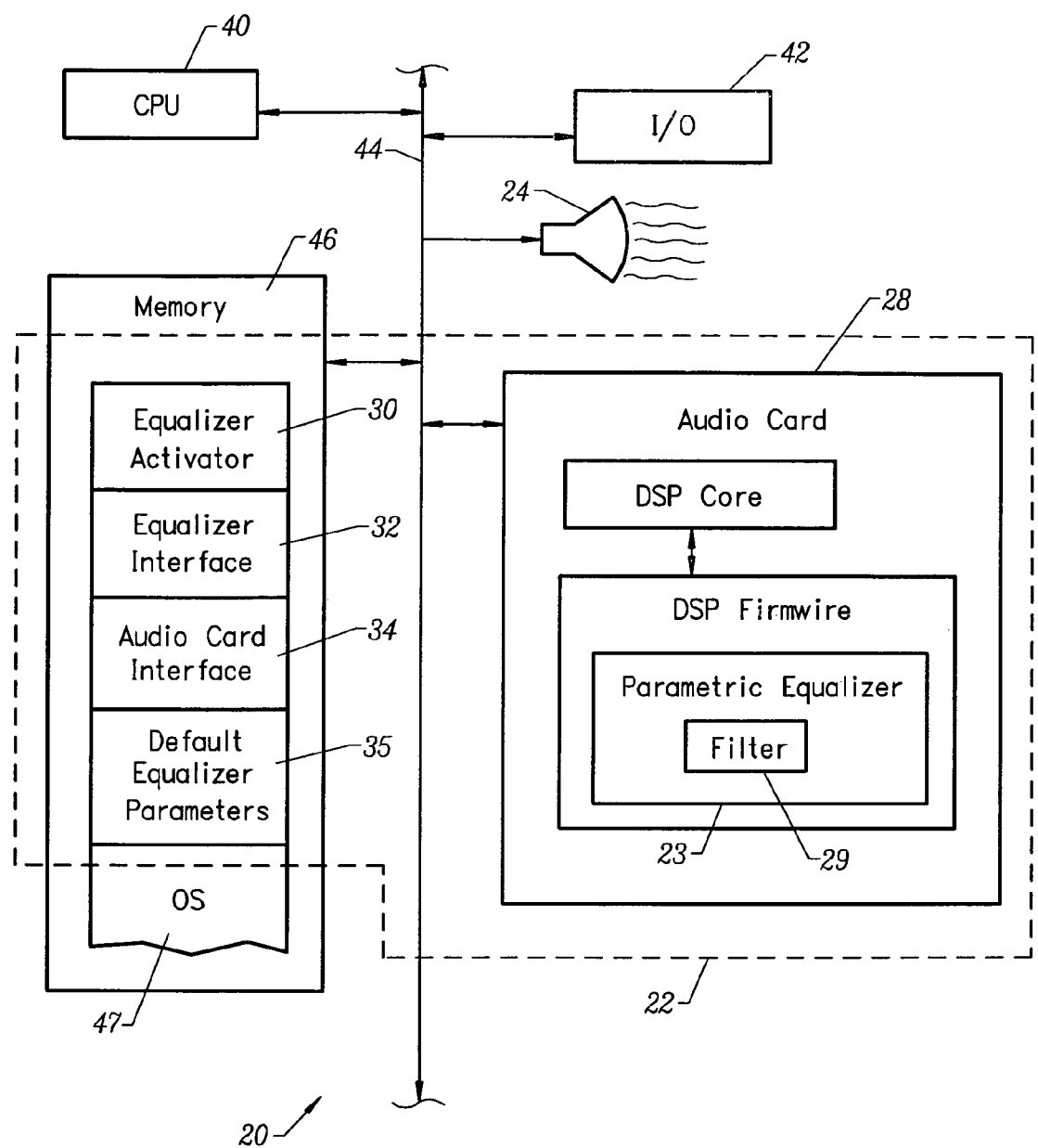
FIG. 3 illustrates the computer system in which the present invention operates.
Figure 5:
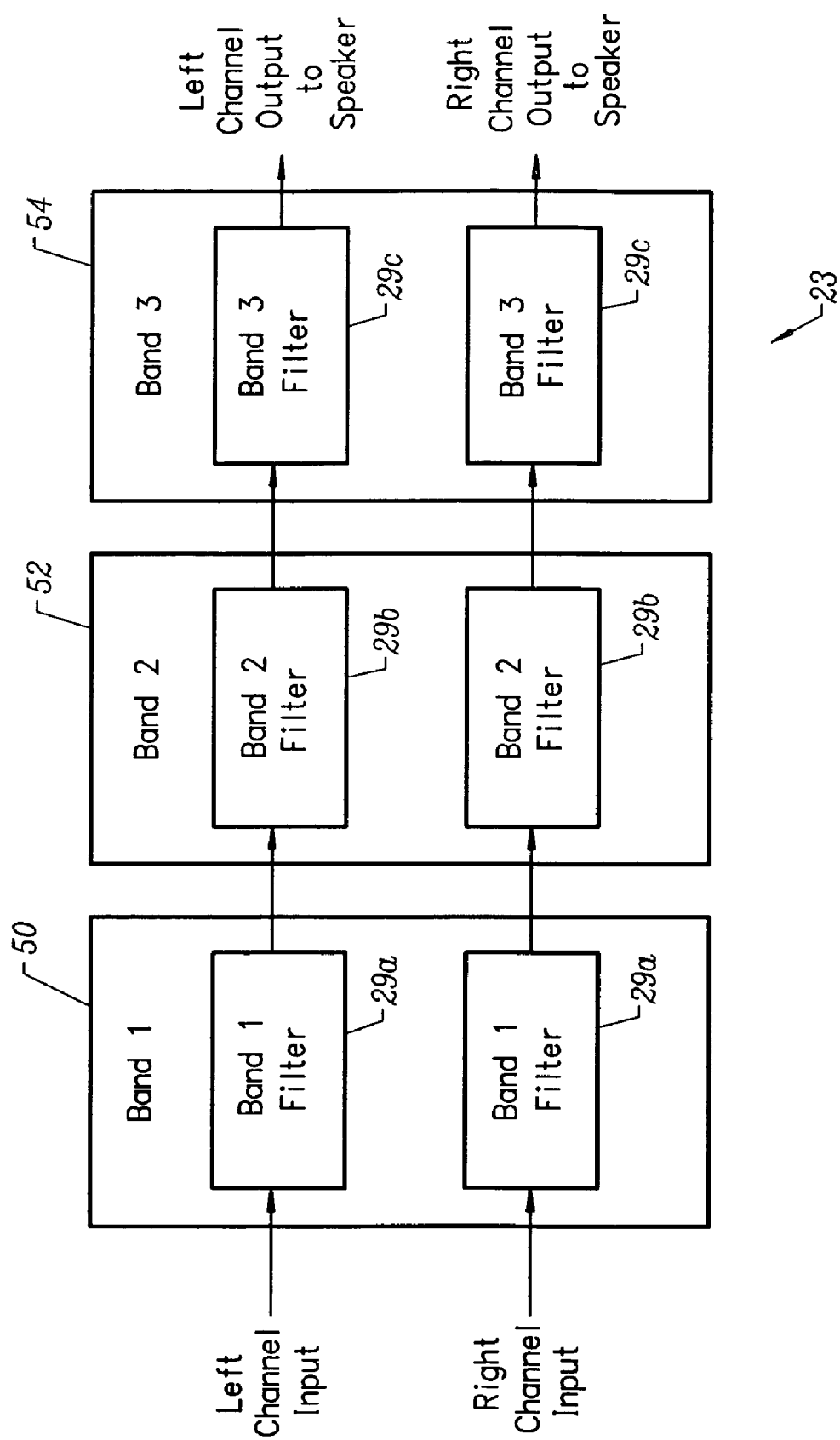
FIG. 5 illustrates the digital parametric equalizer of the present invention.

FIG. 3 illustrates in block diagram form computer system 20, which includes audio system 22 for improving the sound quality of speaker 24. Audio system 22 includes the digital parametric equalizer 23 of the present invention. According to the present invention, Equalizer Activator 30 selects default equalizer parameters based upon whether or not speaker 24 is a Universal System Bus (USB) speaker, and if so, the USB speaker type. Equalizer Activator 30 will be described in greater detail with respect to FIG. 6. Equalizer Interface 32 of the present invention enables users of computer system 20 to modify the default equalizer parameters, while insuring a minimum threshold of sound quality and providing improved sound quality in most instances. Equalizer Interface 32 will be described in greater detail with respect to FIGS. 7–10. Using the equalizer parameters, Audio System 22 implements a parametric equalizer 23, thereby modifying audio data prior to input to speaker 24 and improving its perceived audio quality. The parametric equalizer 23 and Filter 29 will be described in greater detail with respect to FIGS. 5 and 11–12.

Prior to a more detailed discussion of the parametric equalizer 23, first consider FIG. 3 and the context in which the present invention operates. Computer system 20 includes Central Processing Unit (CPU) 40 that communicates with a set of input/output devices 42 over system bus 44. System bus 44 may be a Universal System Bus (USB). Input/output devices 42 include a keyboard, mouse, video monitor, printer, etc (not illustrated). CPU 40 controls and coordinates the operations of computer system 20 by executing instructions stored in machine readable form in memory 46. Those instructions include Equalizer Activator 30, Equalizer Interface 32, AudioCard Interface 34, and Operating System (OS) 47. The interactions between CPUs 40, input/output devices 42, system buses 44, and memories 46 are known in the art.

A. Overview of the Audio System and the Digital Parametric Equalizer

Still referring to FIG. 3, speaker 24 enables computer system 20 to play music CDS and to provide game sound effects. There are a number of commercially available speakers for personal computers, including, for example, the LCS-150 produced by LABTAC of Vancouver, Wash., and the SB-881A produced by Pontech of Taiwan. Alternatively, speaker 24 may be a USB speaker, able to identify its type to system 20. (In which case, bus 44 will be a USB.) Each commercially available speaker has a different frequency response; however, none of them produces the sound quality most consumers have come to expect. Audio system 22 improves the perceived sound quality of speaker 24 by implementing the digital parametric equalizer 23 of the present invention. Audio system 22 does so using Equalizer Activator 30, Equalizer Interface 32, AudioCard Interface 34 and AudioCard 28. AudioCard 28 may be realized using any commercially available personal computer audio card, including, for example, the OTI-608 AC'97 Audio Codec produced by Oak Technology of Sunnyvale, Calif.

Figure 4:
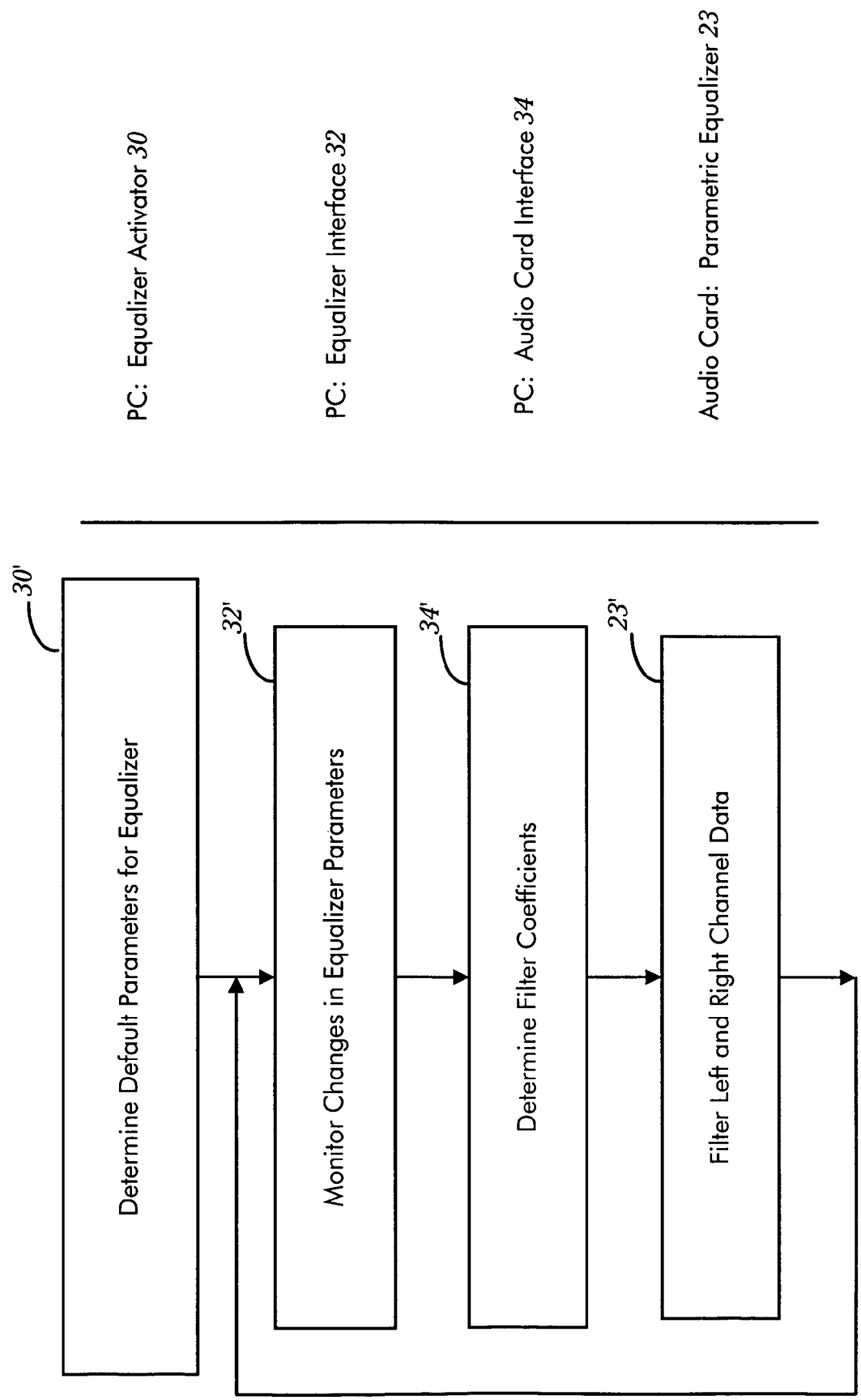
FIG. 4 illustrates the inter-relationship of the software modules of the present invention.

FIG. 4 illustrates the interaction between Equalizer Activator 30, Equalizer Interface 32, AudioCard Interface 34 and Filter 29 of Audio Card 28 and their order of execution. The text on the left hand side of FIG. 4 briefly describes the function of each module, while the text on the right hand side of FIG. 4 identifies which device, AudioCard 28 or CPU 40, executes each module 30, 32, 34 and 29. During step 30' Equalizer Activator 30 determines the default parameter values for digital parametric equalizer 23 based upon whether or not speaker 24 is a USB speaker, and if so its type. During step 32' Equalizer Interface 32 presents an equalizer user interface to the computer user and monitors it for user specified equalizer parameters. AudioCard Interface 34 takes the equalizer parameter values and determines filter coefficients for the digital parametric equalizer 23 and couples them to AudioCard 28 during step 34'.

During step 23' AudioCard 28 takes the information from AudioCard Interface 34 and instantiates as many instances of Filter 29 as necessary to realize digital parametric equalizer 23. Digital parametric equalizer 23 filters left and right channel audio data prior to its input to speaker 24, thereby improving the sound quality of computer system 20. In the embodiment illustrated in FIG. 5, digital parametric equalizer 23 includes three serially coupled bands, band1 50, band2 52 and band3 54. (Digital parametric equalizer 23 can easily be modified to include a greater or lesser number of bands consistent with the present invention.) Each equalizer band 50, 52, and 54 includes two identical filters 29, one for each channel of audio data. In other words, the filters 29 of a band share the same values for equalizer parameters: center frequency, $F_c$; bandwidth, Q; and cut/boost, G. The default values for these equalizer parameters are set by Equalizer Activator 30, while Equalizer Interface 32 allows user specification of the values of equalizer parameters.

Preferably, Filter 29 is realized as a normalized four-multiply ladder filter, although other filter types may be used to realize digital parametric equalizer 23 consistent with the present invention. An improved normalized four-multiply ladder filter that can be used to realize digital parametric equalizer 23 will be described in greater detail below.

B. The Equalizer Activator

Figure 6:
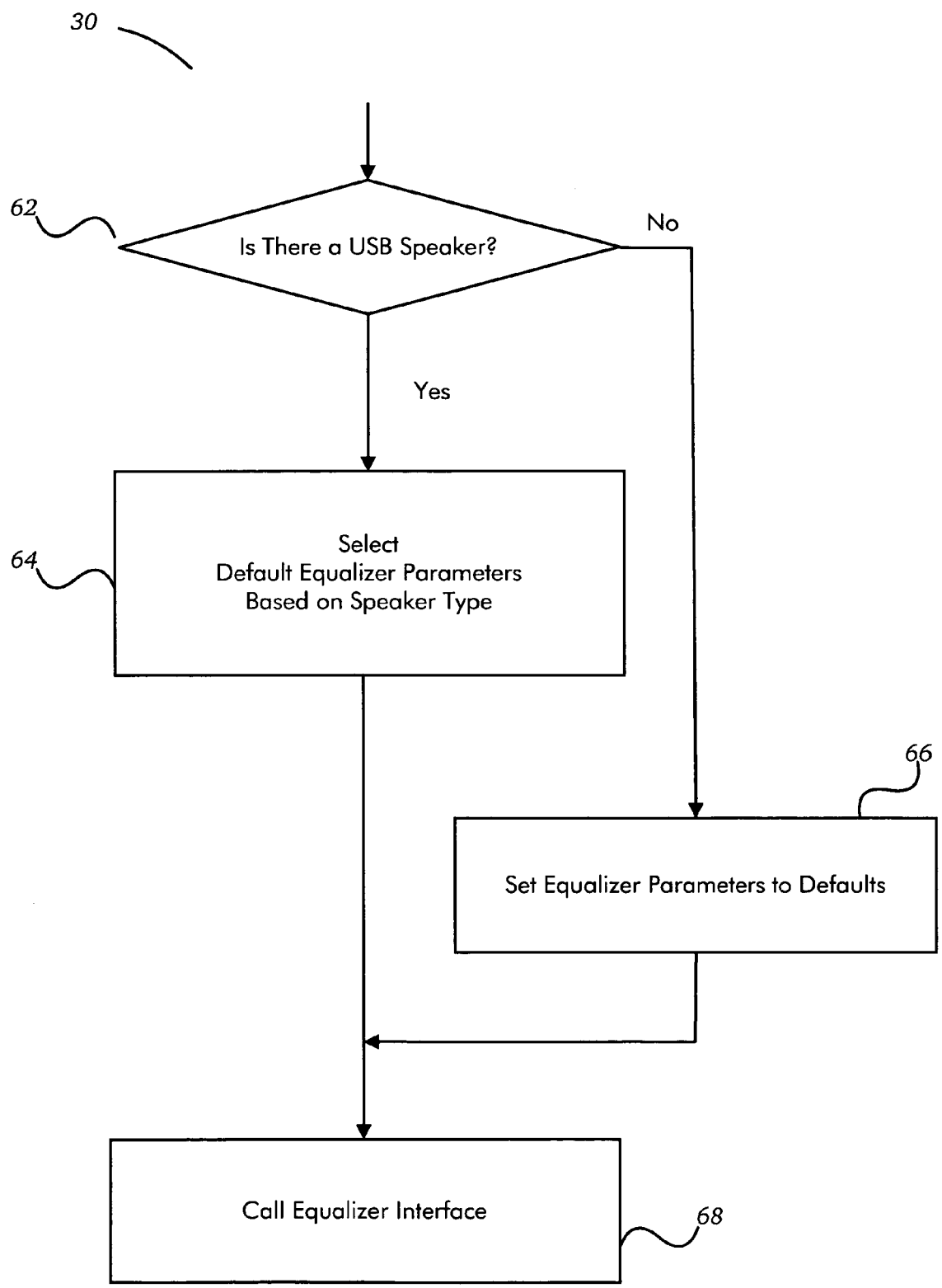
FIG. 6 illustrates in flow diagram form the instructions of the Equalizer Activator module.

FIG. 6 illustrates, in flow diagram form, the steps, or instructions, of Equalizer Activator 30, which may be realized in any computer language, including C++. Briefly described, Equalizer Activator 30 selects default equalizer parameter values and activates the parametric equalizer user interface.

Equalizer Activator 30 begins in step 62 of FIG. 6 by determining whether speaker 24 is a USB speaker. Essentially, this is a determination of whether bus 44 is a USB. If so, speaker 24 will respond to a query by identifying its USB speaker type. Equalizer Activator 30 uses the USB speaker type during step 64 to select default equalizer parameters 35 stored in memory 46. In one embodiment of the present invention, a different set of default equalizer parameter values is stored for each type of commercially available USB speaker. The default values chosen for each USB speaker depend upon the actual frequency response of the speaker and the desired frequency response—that is to say, the default equalizer parameter values are largely a design choice. For example, one possible set of default equalizer parameter values is: Band1: $F_c$=80 Hz, Q=0.8, G=+15 dB; Band2: $F_c$=4 KHz, Q=0.3, G=−3 dB; and Band3: $F_c$=16 KHz, Q=5, G=+6 dB.

Discovery that speaker 24 is not a USB speaker forces Equalizer Activator 30 to advance to step 66. Unable to determine the type of speaker 24, Equalizer Activator 30 selects a set of default equalizer parameter values, which will be used for all non-USB speakers. This set of default equalizer parameter values may be equal to, or different from, a set of default equalizer parameter values associated with a USB speaker. Alternatively, even though computer system 20 is unable to automatically identify the type of non-USB speakers, sets of default equalizer parameter values for such speakers may be stored in memory 46 and presented to the computer user at a later point, permitting the user to manually select the appropriate set of default equalizer parameter values. Possible default equalizer parameter values for some commercially available non-USB speakers are:

LABTAC LCS-150—Band1: (150 Hz, 0.9, +12 dB); Band2:(4 kHz, 2, −3 dB);
Band3: (18 kHz, 7, 15 dB)
Pontech SB-881A—Band1: (80 Hz, 0.7, +15 dB); Band2: (4 kHz, 2, −3 dB);
Band3: (16 kHz, 5, 6 dB)

After selecting appropriate default equalizer parameter values, Equalizer Activator 30 advances to step 68. There Equalizer Activator 30 enables the user to modify the default equalizer parameter values by calling Equalizer Interface 32.

C. The Equalizer Interface

Figure 7:
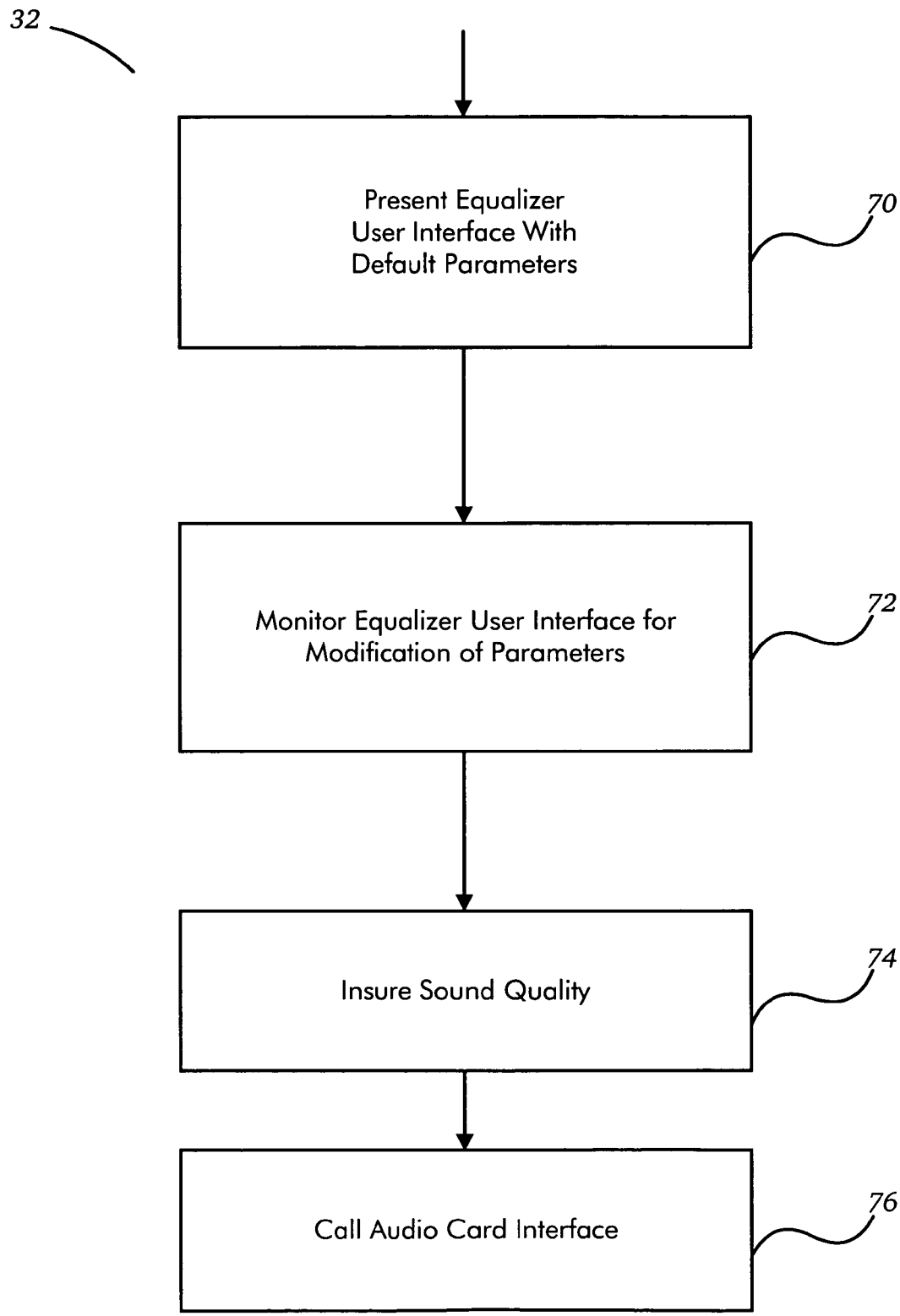
FIG. 7 illustrates the instructions of the Equalizer Interface module.

FIG. 7 illustrates, in flow diagram form, the steps of Equalizer Interface 32. Briefly described, Equalizer Interface 32 enables users of computer system 20 to modify the equalizer parameter values prior to their input to the parametric equalizer 23. Additionally, Equalizer Interface 32 warns users when the equalizer parameter values they have chosen may lead to inferior sound quality.

Figure 8:
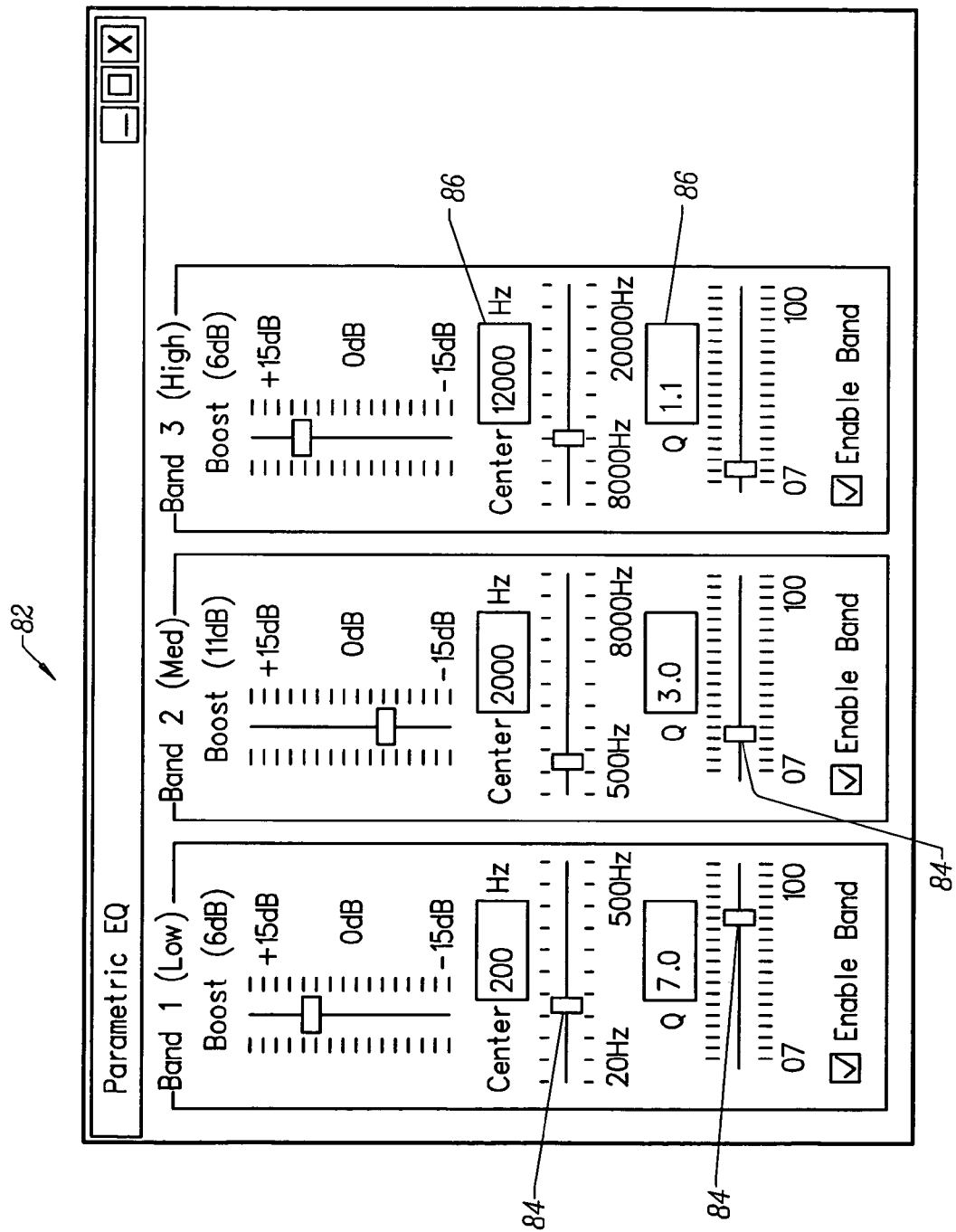
FIG. 8 illustrates one possible implementation of an equalizer user interface.

Equalizer Interface 32 begins by presenting an equalizer user interface to a computer user during step 70. The equalizer user interface allows the computer user to manually modify the equalizer parameters for each band. FIG. 8 illustrates one possible implementation of the equalizer user interface, graphical user interface 82, which resembles a conventional analog equalizer. Other implementations of the equalizer user interface are compatible with the present invention and need not be described in detail herein. Upon its initial presentation, equalizer user interface indicates the default equalizer parameter values selected by Equalizer Activator 30. After presenting the equalizer user interface, during step 72 Equalizer Interface 32 monitors the equalizer user interface for any indication that the user is manually modifying an equalizer parameter. For example, moving a slider bar 84 or selecting an input window 86 both indicate a possible alteration of a band's parameter values. In response, Equalizer Interface 32 examines slider bar positions and input windows to determine each band's equalizer parameter values.

During step 74 Equalizer Interface 32 examines the new equalizer parameter values to determine whether they are compatible with the performance capabilities of audio system 22. In particular, the module Insure Sound Quality 74 prevents sound clipping by accepting only equalizer parameter values that are compatible with the performance capabilities of audio system 22. Afterward, during step 76 Equalizer Interface 32 passes equalizer parameter values to AudioCard Interface 34.

Figure 9:
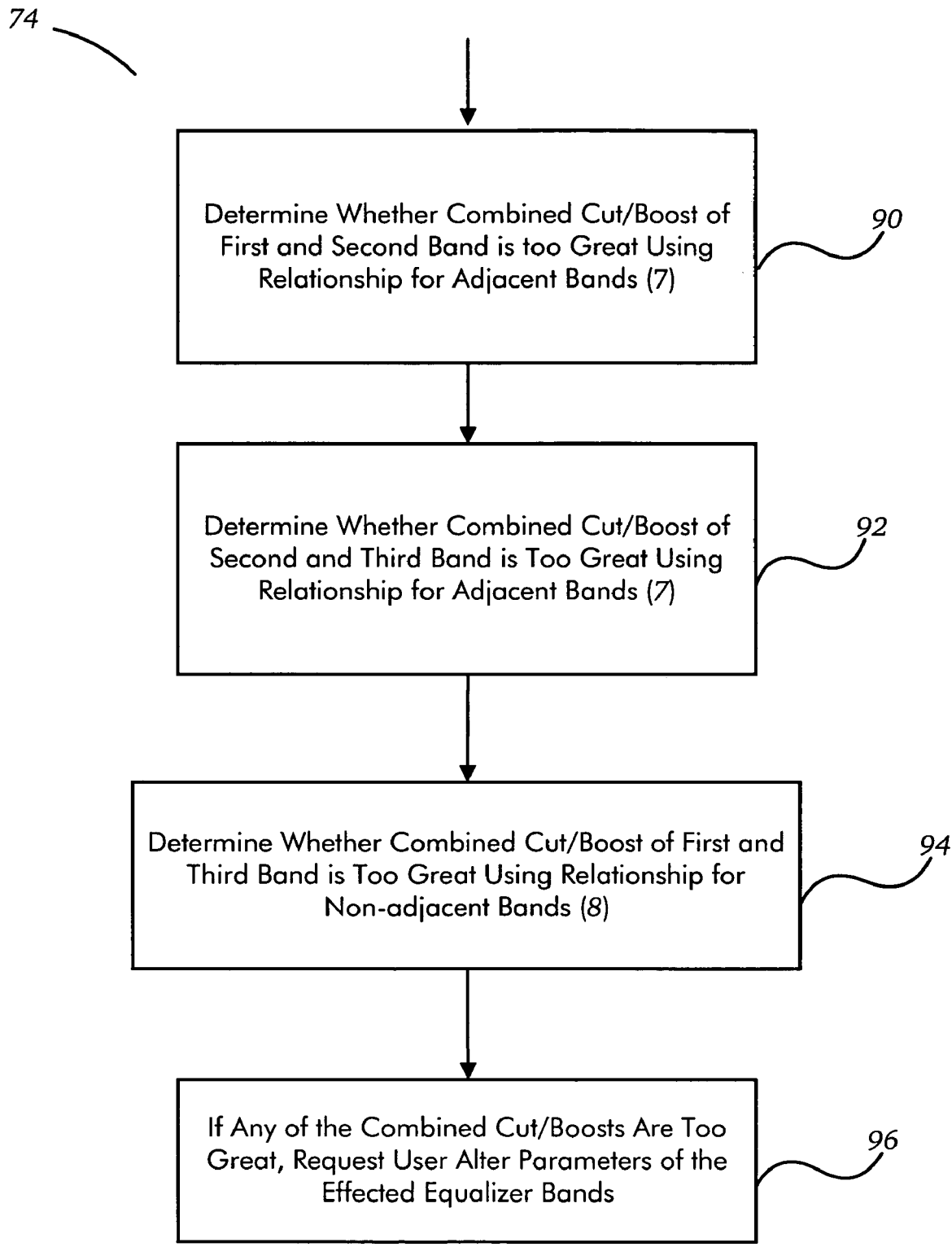
FIG. 9 illustrates the instructions of the Insure Sound Quality module.

FIG. 9 illustrates an embodiment of the module Insure Sound Quality 74 in flow diagram form. Briefly described, Insure Sound Quality 74 prevents clipping by monitoring the value of the overall cut/boost of digital parametric equalizer 23 to insure that this value can be represented by AudioCard 28 without overflowing.

Insure Sound Quality 74 begins in step 90 by estimating the combined cut/boost of two adjacent bands, Band1 50 and Band 2 52. Insure Sound Quality 74 does so using Relationship (7) for adjacent bands.

$$(\log_{10} G_1 + \log_{10} G_2) - 0.9 \left[ \frac{|Fc_1 - Fc_2|}{\left(\frac{Fc_1}{Q_1} + \frac{Fc_2}{Q_2}\right) * \ln 10} \right] \leq X \quad (7)$$

The precise value, X, that the combined cut/boost of adjacent bands should be less than will vary depending upon the personal computer audio card used. A total combined cut/boost for adjacent bands of 0.75, or less, is preferred when AudioCard 28 is realized using an Audio Codec with only three of sixteen bits available for equalization, such as Oak Technogy's' OTI 608. A higher value of X is possible when an audio card with 24 or more bits is used to realize AudioCard 28. Subsequently, during step 92 Insure Sound Quality 74 estimates whether the combined cut/boost of the other two adjacent bands, Band2 52 and Band3 54, is acceptable. This is also done using Relationship 7.

During step 94 Insure Sound Quality 74 estimates whether the total combined cut/boost of the non-adjacent bands, Band1 50 and Band3 54, is acceptable using Relationship 8.

$$(\log_{10} G_1 + \log_{10} G_3) - 1.1 \left[ \frac{|Fc_1 - Fc_3|}{\left(\frac{Fc_1}{Q_1} + \frac{Fc_3}{Q_3}\right) * \ln 10} \right] \leq Y \quad (8)$$

As with the relationship for adjacent bands, the precise value, Y, that the combined cut/boost of non-adjacent bands should be less than will vary depending upon the personal computer audio card used. A total combined cut/boost for non-adjacent bands of 0.75, or less, is preferred when using a sixteen bit Audio Codec, such as the OTI 608, to realize AudioCard 28. As discussed previously with respect to X, higher values of Y are possible when realizing AudioCard 28 with a twenty-four bit or more Audio Codec.

If Insure Sound Quality 74 determines that the combined gains of any of the bands is not acceptable, then during step 74 the user is informed via the equalizer user interface that the cut/boost of the relevant bands should be reduced to improve sound quality.

D. The AudioCard Interface

Figure 10:
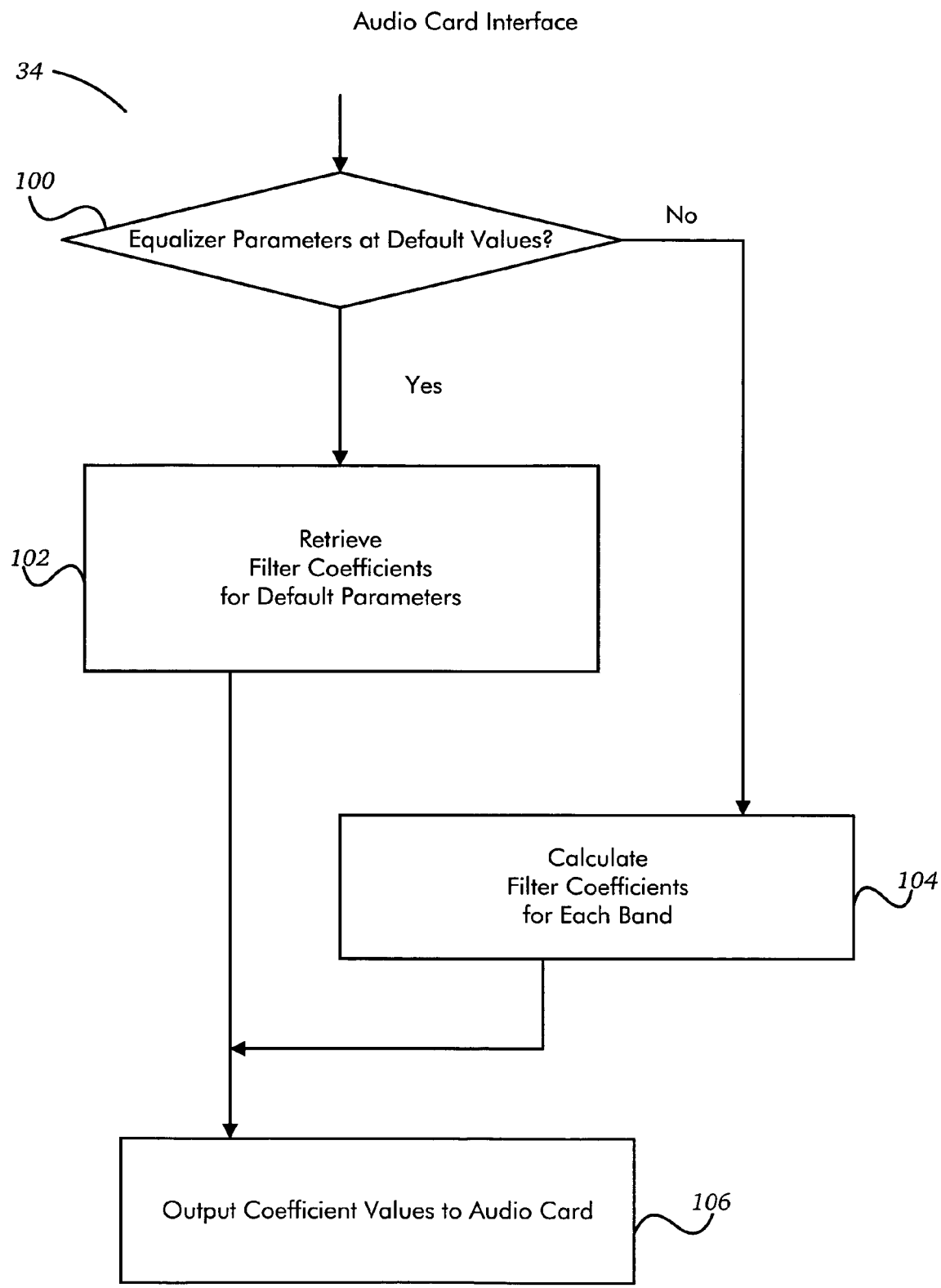
FIG. 10 illustrates the instructions of the AudioCard Interface module.

FIG. 10 illustrates, in flow diagram form, the instructions of AudioCard Interface 34. Briefly described, AudioCard Interface 34 takes the equalizer parameter values and produces tuning coefficients and filter coefficients for each band 50, 52, and 54 of digital parametric equalizer 23.

AudioCard Interface 34 begins in step 100 by determining whether the equalizer parameter values provided by Equalizer Interface 32 are default values. This may be done by comparing the values received from Equalizer Interface with those in memory 46. If the current equalizer parameter values are the default values, then AudioCard Interface 34 produces filter coefficient values simply by retrieving them from memory 46.

On the other hand, if AudioCard Interface 34 determines that the current equalizer parameter values are not default values, then during step 104 AudioCard Interface 34 calculates filter coefficient values for each band 50, 52 and 54 using the current equalizer parameter values. The precise filter coefficients to be calculated depend upon the particular implementation chosen for Filter 29. Calculating filter coefficients for one implementation of Filter 29 will be discussed in detail below.

Having calculated the necessary filter variable values, AudioCard Interface 34 advances to step 106. During step 106 AudioCard Interface 34 provides to AudioCard 28 the filter coefficient values just calculated.

E. The Improved Ladder Filter

Referring once more to FIG. 5, Filter 29 of digital parametric equalizer 23 may be realized using the improved four-multiply normalized ladder filter of the present invention. The improved normalized four-multiply ladder filter produces symmetrical cut and boost spectrums. As a result, the performance of equalizer 23 more closely approximates that of ideal equalizers, enabling frequencies to be cut as deeply as they are boosted. This improved filter is similar, but not identical, to the prior four-multiply normalized ladder filter discussed above. Specifically, filter 29 uses the signal flow diagram of FIG. 1, the transfer function of Relationship 1, the first tuning coefficient of Relationship 3, the first filter coefficient of Relationship 5 and the second filter coefficient of Relationship 6. Despite these similarities between filter 29 and the prior art filter, each equalizer band 50, 52 and 54 produces an output signal with symmetrical cut and boost spectrums. This performance gain arises from the present invention's understanding and use of the second tuning coefficient, $k_2$. Analysis revealed that the second tuning coefficient, $k_2$, caused the asymmetry between cut and boost spectrums produced by prior art devices. Further analysis revealed that a filter's cut and boost spectrums could be made symmetrical using one Relationship for $k_2$ while boosting and using another Relationship for $k_2$ while cutting. These conditions are described by Relationships 9 and 10.

$$k_2=(1-\tan(\pi F_c/(F_s Q)))/(1+\tan(\pi F_c/(F_s Q)) \text{ for } G \geq 1 \quad (9)$$

$$k_2=(G-\tan(\pi F_c/(F_s Q)))/(G+\tan(\pi F_c/(F_s Q)) \text{ for } 0<G<1 \quad (10)$$

Note that Boost Relationship 9 is identical to the prior Relationship 4; however, unlike Relationships 4 and 9, Cut Relationship 10 includes as a variable the cut/boost parameter, G.

Figure 1:
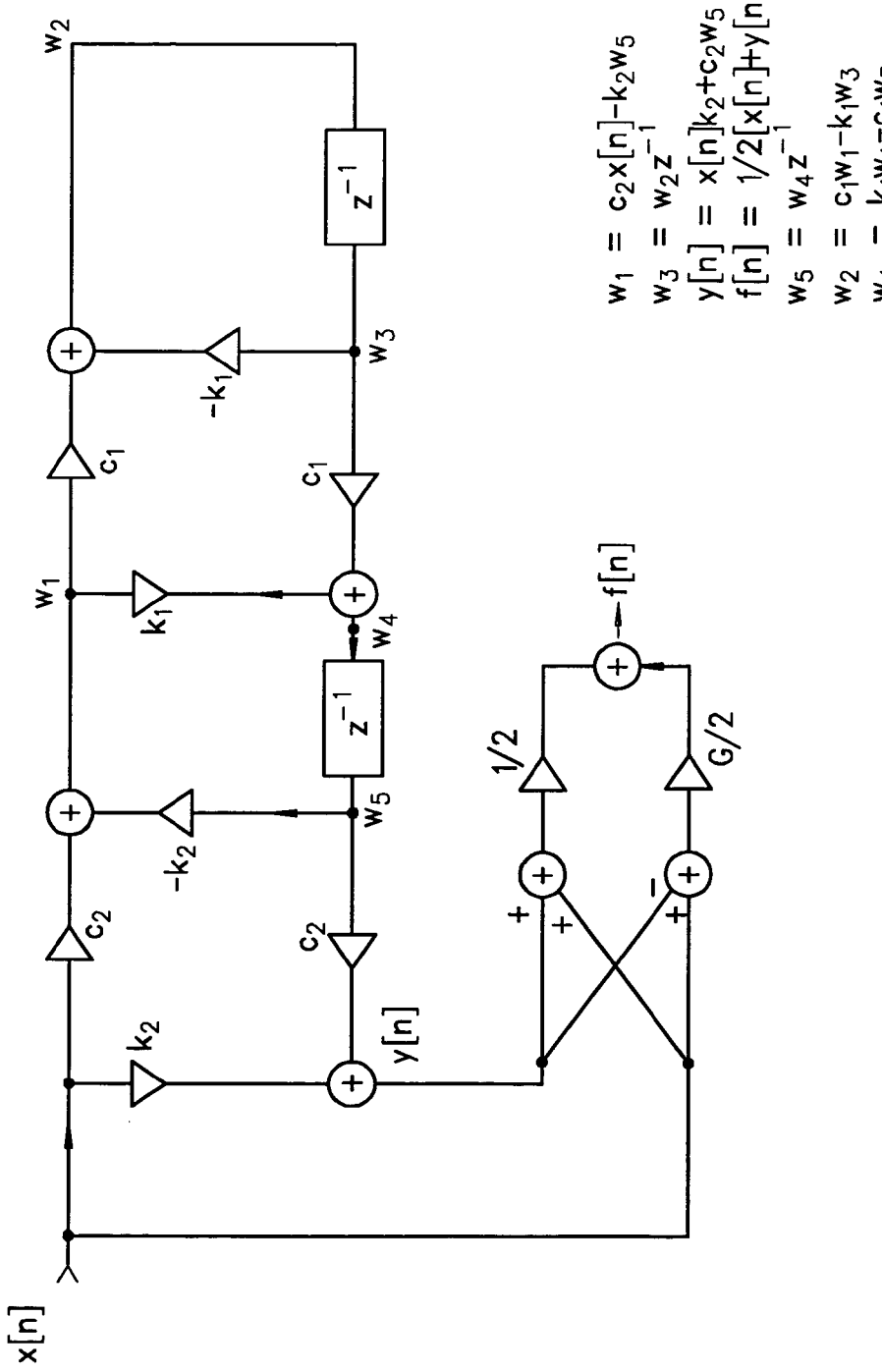
FIG. 1 is a signal flow diagram for a prior art four-multiply normalized ladder filter.

Implementing parametric audio equalizer 23 and filter 29 using a DSP chip, the relationships set forth above and the signal flow diagram of FIG. 1 will be clear to one of ordinary skill in the art.

Figure 2:
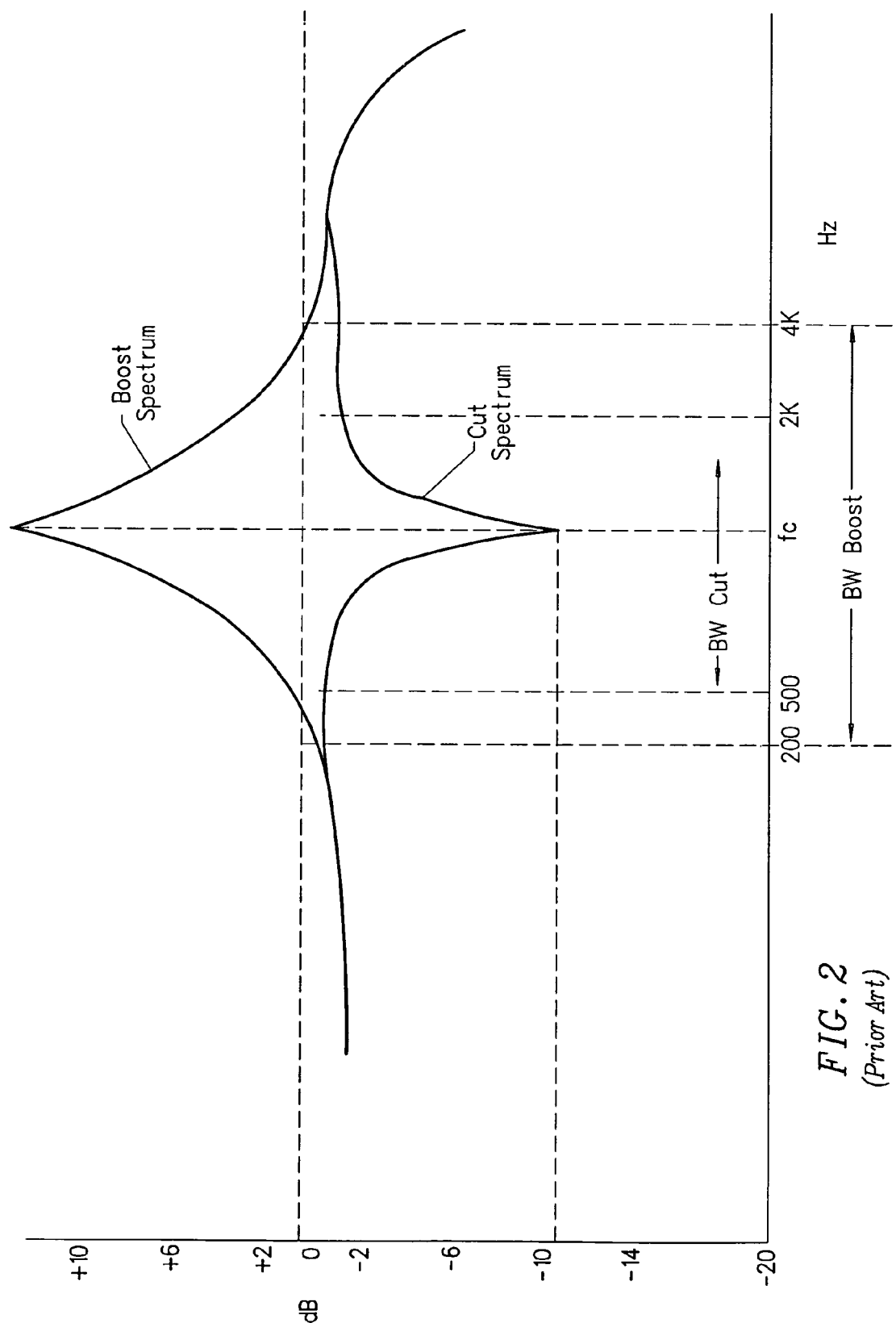
FIG. 2 illustrates the cut and boost spectrum of the prior art four-multiply normalized ladder filter.
Figure 11:
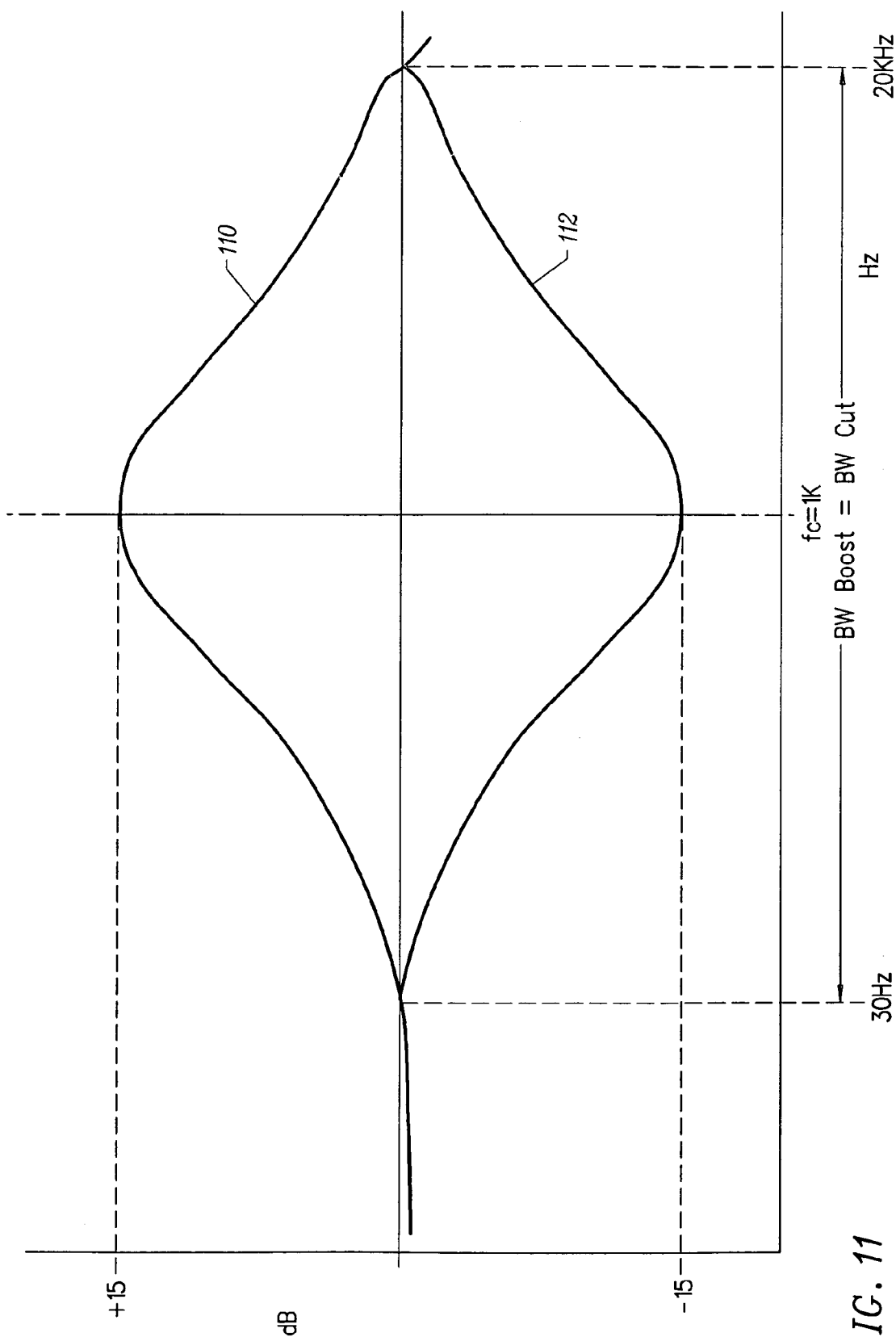
FIG. 11 illustrates the cut and boost spectrum of an instance of the improved four-multiply normalized ladder filter.

FIG. 11 illustrates the frequency response of a filter implemented using Relationships 9 and 10 for $k_2$. Note the symmetry between boost spectrum 110 and cut spectrum 112, especially as compared to the cut and boost spectrums of FIG. 2. Note also that in FIG. 11 the boost bandwidth is equal to the cut bandwidth. Thus, the improved digital parametric equalizer of the present invention more closely approximates ideal equalizer performance and can more deeply notch out undesired frequencies than prior digital parametric equalizers.

Figure 12:
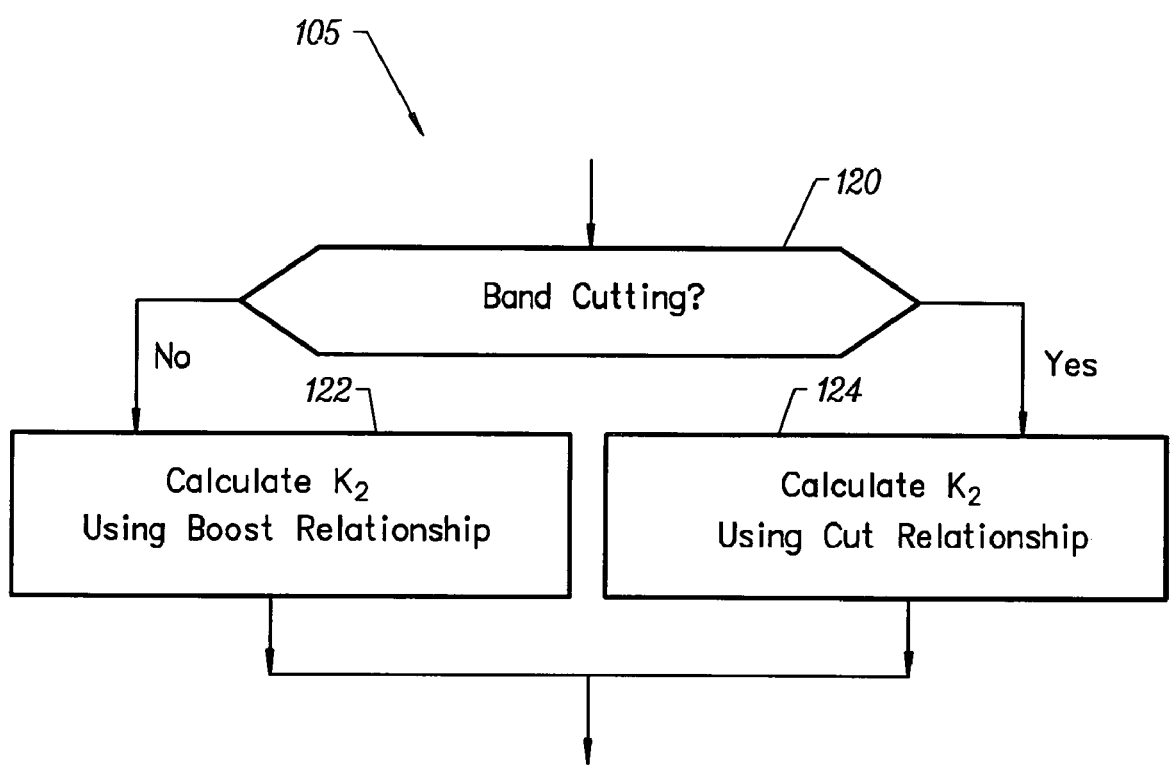
FIG. 12 illustrates the instructions for insuring symmetrical cut and boost spectrums in accordance with the improved four-multiply normalized ladder filter.

FIG. 12 illustrates in flow diagram form instructions 105 that may be added to step 104 of AudioCard Interface 34 to implement the improved ladder filter. Instructions 105 are stored within, and executed by, AudioCard 28. Briefly described, Instructions 105 calculate the second tuning coefficient value, $k_2$ for a band in a manner that insures symmetry of the band's cut and boost spectrum.

During step 120, for the selected band, Instructions 105 first examine the value of the cut/boost parameter to determine whether that band is to cut or boost its input signal. If the value of the cut/boost parameter is equal to one or greater, the band will be boosting, then Instructions 105 use a Boost Relationship to calculate the second tuning coefficient, $k_2$. The Boost Relationship used during step 122 is Relationship 9, set forth above. On the other hand, if the value of the band's cut/boost parameter is less than one, then during step 124 Instructions 105 use a Cut Relationship to calculate the value of the second tuning coefficient, $k_2$. The Cut Relationship used during step 124 is Relationship 10, also set forth above.

F. Conclusion

Thus, a computer readable memory has been described that enables a computer including a speaker to improve the perceived audio quality of that speaker. A first set of instructions causes the computer to determine whether or not the speaker is a USB speaker, and if so, the speaker's type. The second set of instructions causes the computer to select a set of default filter coefficients for a digital filter based upon the type of the speaker. Finally, the third set of instructions causes the computer to realize a parametric equalizer using a digital filter and the set of default filter coefficients. The digital filter produces an output signal to be input to the speaker, thus improving the perceived quality of the speaker.

In the foregoing specification, the invention has been described with reference to specific exemplary embodiments thereof. It will, however, be evident that various modifications and changes may be made thereto without departing from the broader spirit and scope of the invention as set forth in the appended claims. Accordingly, the specification and drawings are to be regarded in an illustrative rather than a restrictive sense.

What is claimed is:

1. A computer readable memory to direct a computer to function in a specified manner, comprising:
a first set of instructions to automatically determine a type of a speaker of the computer;
a second set of instructions to select a set of filter coefficients for a digital filter based upon the type of the speaker; and
a third set of instructions to realize a parametric equalizer using the digital filter, the digital filter producing an output signal to be input to the speaker from the set of filter coefficients and an input signal; wherein the parametric equalizer comprises a plurality of equalizer bands, each equalizer band having one or more filters;
wherein the second set of instructions further include:
a fourth set of instructions to receive user specified equalizer parameters for the parametric equalizer;

a fifth set of instructions to calculate the set of filter coefficients from the user specified equalizer parameters; and a sixth set of instructions for insuring that a value of a cut/boost parameter of the user specified equalizer parameters meets predefined mathematical criteria.

2. A computer readable memory to direct a computer to function in a specified manner, comprising:

a first set of instructions to automatically determine a type of a speaker of the computer;

a second set of instructions to select a set of filter coefficients for a digital filter based upon the type of the speaker; and a third set of instructions to realize a parametric equalizer using the digital filter, the digital filter producing an output signal to be input to the speaker from the set of filter coefficients and an input signal; wherein the parametric equalizer comprises a plurality of equalizer bands, each equalizer band having one or more filters;

wherein the second set of instructions further include:

a fourth set of instructions to receive user specified equalizer parameters for the parametric equalizer;

a fifth set of instructions to calculate the set of filter coefficients from the user specified equalizer parameters;

wherein the third set of instructions comprise:

a sixth set of instructions to realize a first equalizer band of the parametric equalizer, the first equalizer band having a first cut/boost parameter;

a seventh set of instructions to realize a second equalizer band of the parametric equalizer, the second equalizer band having a second cut/boost parameter;

an eighth set of instructions to realize a third equalizer band of the parametric equalizer, the third equalizer band having a third cut/boost parameter; and wherein the computer readable memory further comprises a ninth set of instructions for insuring a first combined cut/boost of the first, second and third equalizer bands meets predefined mathematical criteria.

3. The computer readable memory of claim 2 wherein the ninth set of instructions comprise:

a tenth set of instructions to determine whether a second combined cut/boost of the first equalizer band and the second equalizer band meets predefined mathematical criteria;

an eleventh set of instructions to determine whether a third combined cut/boost of the second equalizer band and the third equalizer band meets predefined mathematical criteria; and a twelfth set of instructions to determine whether a fourth combined cut/boost of the first equalizer band and the third equalizer band meets predefined mathematical criteria.

4. The computer readable memory of claim 3 wherein:

the tenth set of instructions uses a relationship for adjacent bands to determine whether the second combined cut/boost meets predefined mathematical criteria;

the eleventh set of instructions uses the relationship for adjacent bands to determine whether the third combined cut/boost meets predefined mathematical criteria; and the twelfth set of instructions uses a relationship for non-adjacent bands to determine whether the fourth combined cut/boost meets predefined mathematical criteria.

5. A method for improving audio quality of a computer including a Universal Serial Bus (USB) loud speaker, the method comprising the steps of:

a) determining automatically a type of the USB loud speaker of the computer;

b) selecting a first set of filter coefficients if the USB loud speaker is of a first type;

c) selecting a second set of filter coefficients if the USB loud speaker is of a second type;

d) calculating a third set of filter coefficients from equalizer parameters of a parametric equalizer if user specified equalizer parameters are received;

e) selecting the third set of filter coefficients if user specified equalizer parameters are received;

f) realizing a parametric equalizer using a digital filter, the digital filter generating an output signal to be input to the USB loud speaker from an input signal and the selected set of coefficients; wherein the parametric equalizer comprises a plurality of equalizer bands, each such equalizer band having one or more filters; and g) insuring that a value of a cut/boost parameter of the parametric equalizer meets predefined mathematical criteria.

6. A method for improving audio quality of a computer including a Universal Serial Bus (USB) loud speaker, the method comprising the steps of:

a) determining automatically a type of the USB loud speaker of the computer;

b) selecting a first set of filter coefficients if the USB loud speaker is of a first type;

c) selecting a second set of filter coefficients if the USB loud speaker is of a second type;

d) calculating a third set of filter coefficients from equalizer parameters of a parametric equalizer if user specified equalizer parameters are received;

e) selecting the third set of filter coefficients if user specified equalizer parameters are received;

f) realizing a parametric equalizer using a digital filter, the digital filter generating an output signal to be input to the USB loud speaker from an input signal and the selected set of coefficients; wherein the parametric equalizer comprises a plurality of equalizer bands, each such equalizer band having one or more filters; and wherein the parametric equalizer includes a first equalizer band, a second equalizer band and a third equalizer band;

the method including:

g1) determining whether a first combined cut/boost of the first equalizer band and the second equalizer band meets predefined mathematical criteria;

g2) determining whether a second combined cut/boost of the second equalizer band and the third equalizer band meets predefined mathematical criteria; and g3) determining whether a third combined cut/boost of the first equalizer band and the third equalizer band meets predefined mathematical criteria.

7. The method of claim 6 wherein steps g1 and g2 use a relationship for adjacent bands and step g3 uses a relationship for non-adjacent bands.

8. A computer program product for use in conjunction with a computer system, the computer program product comprising a computer readable storage medium and a computer program mechanism embedded therein, the computer program mechanism comprising one or more modules to improve audio quality of the computer system, the one or more modules including:

a first set of instructions to automatically determine a type of a Universal Serial Bus (USB) speaker of the computer system;

a second set of instructions to select a set of filter coefficients for a digital filter based upon the type of the USB speaker; and a third set of instructions to realize a parametric equalizer using the digital filter, the digital filter producing an output signal to be input to the USB speaker from the set of filter coefficients and an input signal; wherein the parametric equalizer comprises a plurality of equalizer bands, each such equalizer band having one or more filters;

wherein the second set of instructions further include:
a fourth set of instructions to receive equalizer parameters; and
a fifth set of instructions to calculate the set of filter coefficients from the equalizer parameters if received without regard to the type of the speaker; and wherein the third set of instructions comprise:
a sixth set of instructions to realize a first equalizer band of the parametric equalizer, the first equalizer band having a first cut/boost parameter;
a seventh set of instructions to realize a second equalizer band of the parametric equalizer, the second equalizer band having a second cut/boost parameter; and
an eighth set of instructions to realize a third equalizer band of the parametric equalizer, the third equalizer band having a third cut/boost parameter;

the one or more modules further including:
a ninth set of instructions for insuring a first combined cut/boost of the first, second and third equalizer bands meets predefined mathematical criteria.

9. The computer program product of claim 8 wherein the ninth set of instructions comprise:
a tenth set of instructions to determine whether a second combined cut/boost of the first equalizer band and the second equalizer band meets predefined mathematical criteria;
an eleventh set of instructions to determine whether a third combined cut/boost of the second equalizer band and the third equalizer band meets predefined mathematical criteria; and
a twelfth set of instructions to determine whether a fourth combined cut/boost of the first equalizer band and the third equalizer band meets predefined mathematical criteria.

10. The computer program product of claim 9 wherein:
the tenth set of instructions uses a relationship for adjacent bands to determine whether the second combined cut/boost meets predefined mathematical criteria;
the eleventh set of instructions uses the relationship for adjacent bands to determine whether the third combined cut/boost meets predefined mathematical criteria; and
the twelfth set of instructions uses a relationship for non-adjacent bands to determine whether the fourth combined cut/boost meets predefined mathematical criteria.

* * * * *